US011450793B2

(12) United States Patent
Wyckoff et al.

(10) Patent No.: US 11,450,793 B2
(45) Date of Patent: Sep. 20, 2022

(54) SEMICONDUCTOR STRUCTURE WITH NANOPARTICLES AND LIGHT EMITTING DEVICE HAVING A PHOSPHOR MATERIAL WITH NANOPARTICLES

(71) Applicant: OSRAM Opto Semiconductors GmbH, Regensburg (DE)

(72) Inventors: James Wyckoff, Portland, OR (US); Joseph Treadway, Portland, OR (US); Kari N. Haley, Portland, OR (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/294,780

(22) Filed: Mar. 6, 2019

(65) Prior Publication Data

US 2020/0287105 A1 Sep. 10, 2020

(51) Int. Cl.
*H01L 33/50* (2010.01)
*H01L 33/56* (2010.01)
*B82Y 20/00* (2011.01)

(52) U.S. Cl.
CPC .......... *H01L 33/507* (2013.01); *H01L 33/502* (2013.01); *H01L 33/56* (2013.01); *B82Y 20/00* (2013.01); *H01L 2933/005* (2013.01); *H01L 2933/0041* (2013.01)

(58) Field of Classification Search
CPC ..... H01L 33/507; H01L 33/56; H01L 33/005; H01L 33/0041; H01L 33/502; H01L 2933/005; H01L 2933/0041; B82Y 20/00
See application file for complete search history.

(56) References Cited

U.S. PATENT DOCUMENTS

| 8,847,197 | B2* | 9/2014 | Pickett | H01L 33/502 |
|           |     |        |         | 257/13 |
| 9,249,354 | B2  | 2/2016 | Mangum et al. | |
| 9,303,153 | B2* | 4/2016 | Nick | C09D 5/22 |
| 9,368,693 | B2  | 6/2016 | Kurtin | |
| 9,478,717 | B2  | 10/2016 | Mangum et al. | |
| 9,722,147 | B2  | 8/2017 | Mangum et al. | |
| 9,778,510 | B2* | 10/2017 | Won | C09K 11/00 |
| 2016/0141463 | A1 | 5/2016 | Kurtin et al. | |
| 2017/0005241 | A1 | 1/2017 | Lotito et al. | |
| 2018/0331262 | A1* | 11/2018 | Kan | C09K 11/025 |

OTHER PUBLICATIONS

Rolf Koole, et al., "On the Incorporation Mechanism of Hydrophobic Quantum Dots in Silica Spheres by a Reverse Microemulsion Method," Chem. Mater., vol. 20, No. 7, Jun. 3, 2008, pp. 2503-2512.

* cited by examiner

*Primary Examiner* — Steven B Gauthier
*Assistant Examiner* — Candice Chan
(74) *Attorney, Agent, or Firm* — Slater Matsil, LLP (57) ABSTRACT

A semiconductor structure, a method for producing a semiconductor structure and a light emitting device are disclosed. In an embodiment a semiconductor structure includes a plurality of discrete encapsulated semiconductor nanoparticles and a plurality of discrete semiconductor free nanoparticles, wherein the discrete encapsulated semiconductor nanoparticles and the discrete semiconductor free nanoparticles form an agglomerate.

13 Claims, 7 Drawing Sheets

SEMICONDUCTOR STRUCTURE WITH NANOPARTICLES AND LIGHT EMITTING DEVICE HAVING A PHOSPHOR MATERIAL WITH NANOPARTICLES

TECHNICAL FIELD

The invention relates to a semiconductor structure. It further relates to a method of producing a semiconductor structure. It yet further relates to a light-emitting device containing a semiconductor structure.

BACKGROUND

Networks of semiconductor structures with fused insulator coatings and methods of fabricating networks of semiconductor structures with fused insulator coatings are described in U.S. Pat. Nos. 9,478,717, 9,249,354 and 9,722,147. Even in these networks, a high number of thinly coated semiconductor nanoparticles exist on the outside and around the periphery of the formed network which leaves the particles susceptible to degradation.

SUMMARY

Embodiments provide a semiconductor structure with improved properties. Further embodiments provide a method of producing a semiconductor structure with improved properties and a light-emitting device with a semiconductor structure with improved properties.

According to embodiments, a semiconductor structure is provided comprising a plurality of discrete encapsulated semiconductor nanoparticles. In particular, the semiconductor nanoparticles may be used as a conversion material for converting the wavelength of electromagnetic radiation which passes through at least part of the conversion material.

"Wavelength conversion" means here and in the following that incident electromagnetic radiation of a first wavelength range is converted in electromagnetic radiation of a second wavelength range which comprises preferably longer wavelengths than the incident electromagnetic radiation. In general, wavelength converting materials absorb electromagnetic radiation of the incident radiation, convert the absorbed radiation at least partially in electromagnetic radiation of the second wavelength range by a molecular and/or atomic mechanism and reemit the converted radiation. In particular, scattering or absorption alone is not meant with wavelength conversion.

"Encapsulated semiconductor nanoparticles" are to be understood as being encapsulated in an encapsulation material. The encapsulation is provided, in particular, to protect the semiconductor nanoparticles from external influences like oxygen or water as these external influences can lead to an oxidation and therefore to a degradation of the semiconductor nanoparticles. The semiconductor nanoparticles or a majority of the semiconductor nanoparticles are at least partially, preferably completely, surrounded by the encapsulation material. This is to say that the semiconductor nanoparticles can be surrounded by the encapsulation material from all sides. Furthermore, the semiconductor nanoparticles can be in direct contact with the encapsulation material. In addition, at least the majority of semiconductor nanoparticles is individually encapsulated, i.e., one semiconductor nanoparticle comprises at least one layer of encapsulation material.

"Discrete encapsulated semiconductor nanoparticle" means that each encapsulated semiconductor nanoparticle has a finite size and is generally distinguishable from every other nanoparticle. In addition, each individual encapsulated semiconductor nanoparticle is referred to as a discrete nanoparticle even if it is bonded to another nanoparticle or sticks to another nanoparticle as long as the individual spatial form of each nanoparticle remains distinguishable.

The discrete encapsulated semiconductor nanoparticles can be understood as three-dimensional objects. For example, they can be spherical and/or elongated particles, but is to be noted that the discrete semiconductor nanoparticles are not restricted to a specific spatial form. Rather, they may comprise any regular or irregular three-dimensional shape and may comprise zero, one or more edges.

According to at least one embodiment of the semiconductor structure, the semiconductor structure comprises a plurality of discrete semiconductor free nanoparticles. The term semiconductor free means that no semiconductor nanoparticle is present in the semiconductor free nanoparticles.

"Discrete semiconductor free nanoparticles" means that each semiconductor free nanoparticle has a finite size and is generally distinguishable from every other nanoparticle. In addition, each individual semiconductor free nanoparticle is referred to as a discrete nanoparticle even if it is bonded to another nanoparticle or sticks to another nanoparticle as long as the individual spatial form of each nanoparticle remains distinguishable.

The discrete semiconductor free nanoparticles can be understood as three-dimensional objects. They are not restricted to a specific spatial form. Rather, they may comprise any regular or irregular three-dimensional shape and may comprise zero, one or more edges. For example, they can be spherical and/or elongated particles.

The semiconductor free nanoparticles can be smaller than or larger than or equal to the encapsulated semiconductor nanoparticles in size. In addition, a mixture of different sizes of semiconductor free nanoparticles in the semiconductor structure is possible. In this case, the semiconductor free nanoparticles can both be smaller or larger than the encapsulated semiconductor nanoparticles as well as equal to the encapsulated semiconductor nanoparticles in size.

According to at least one embodiment the discrete encapsulated semiconductor nanoparticles and the discrete semiconductor free nanoparticles form an agglomerate.

An agglomerate is to be understood as an association of the plurality of discrete nanoparticles. Discrete nanoparticles are here and in the following understood to be both the encapsulated semiconductor nanoparticles and the semiconductor free nanoparticles. The association of the discrete nanoparticles in the agglomerate may be arranged via point-to-point connections between the individual discrete nanoparticles. The point-to-point connections between the individual discrete nanoparticles may be, for example, non-covalent or covalent chemical bonds or interactions. The point-to-point connections are restricted to a certain area on the surface of a nanoparticle. In other words, the nanoparticles are not bonded to each other over the full surface. Due to these point-to-point connections, a network between the individual discrete nanoparticles may be formed.

In the agglomerate, the spatial forms of the individual discrete nanoparticles can be recognized. Therefore, random gaps and/or interstices between the individual discrete nanoparticles may be present in the agglomerate. The existence of these random gaps and/or interstices can be due to the spatial form of the discrete nanoparticles. The random gaps and/or interstices are finite areas that are surrounded by at least two discrete nanoparticles. They can be located both in the center of the agglomerate and in a periphery of the agglomerate. The random gaps and/or interstices are filled with the ambient atmosphere. In particular, the random gaps and/or interstices can be filled with air.

The size of the agglomerate is large in comparison to the average size of the discrete nanoparticles. For example, the agglomerate may have an extension of 100 nm to 40 μm, wherein the corresponding discrete nanoparticles may have an extension of about 50 nm each.

According to one embodiment, the agglomerate is self-supporting. This is to say that the agglomerate can thus be free of an additional carrier or substrate. The stability of the agglomerate is achieved by point-to-point connections between the individual discrete nanoparticles. In particular, point-to-point connections between the encapsulated semiconductor nanoparticles and the semiconductor free nanoparticles lead to an increased mechanical stability. A particularly increased stability is achieved when small semiconductor free nanoparticles are punctually bonded to the encapsulated semiconductor nanoparticles. Small semiconductor free nanoparticles mean that the semiconductor free nanoparticles are smaller than the encapsulated semiconductor nanoparticles in the agglomerate. In this case, the small semiconductor free nanoparticles can be arranged in some of the random gaps and/or interstices between semiconductor nanoparticles in the agglomerate attaining a more complex and therefore more stable network.

According to at least one embodiment, the semiconductor structure comprises a plurality of discrete encapsulated semiconductor nanoparticles and a plurality of discrete semiconductor free nanoparticles, wherein the discrete encapsulated semiconductor nanoparticles and the discrete semiconductor free nanoparticles form an agglomerate.

Additionally to the encapsulation of the semiconductor nanoparticles, the agglomerate comprising encapsulated semiconductor nanoparticles and semiconductor free nanoparticles provides additional protection for the semiconductor nanoparticles against degradation beyond the individual encapsulation layer alone.

According to at least one embodiment, the encapsulated semiconductor nanoparticles each comprise a semiconductor nanoparticle and an encapsulation. Furthermore, the encapsulation can comprise or consist of the same material as the semiconductor free nanoparticle.

According to at least one embodiment of the semiconductor structure, each of the plurality of discrete encapsulated semiconductor nanoparticles comprises a quantum dot. That is to say that the semiconductor nanoparticle in the encapsulated semiconductor nanoparticles comprises or consists of a quantum dot. The quantum dot can comprise or consist of at least one semiconductor material. Each quantum dot may, for example, comprise a core comprising a first semiconductor material and, optionally, at least one shell comprising a second different semiconductor material with the shell at least partly, preferably completely, surrounding the core. The semiconductor materials can, for example, comprise or consist of group II-VI, group III-V, group IV-VI, group I-III-VI and group II-IV-VI semiconductors as well as alloys or mixtures thereof, in particular CdSe, InAs, ZnSe, InP, GaP, CdS, ZnS, HgTe, PbSe, PbS as well as ternary and doped materials such as $CuInS_2$ as well as alloys or mixtures thereof. The semiconductor particle can, for example, have a diameter between 2 nm inclusive and 50 nm inclusive.

According to one embodiment, each of the plurality of discrete encapsulated semiconductor nanoparticles comprises an encapsulation comprising an encapsulation material. An encapsulated semiconductor nanoparticle can, for example, have a diameter of 5 nm inclusive to 100 nm inclusive, in particular of 50 nm.

It is possible that each encapsulation contains more than one particle of the semiconductor nanoparticles. It is preferred, however, that each encapsulation only contains one nanoparticle of the semiconductor nanoparticles.

According to at least one embodiment of the semiconductor structure, the discrete semiconductor free nanoparticles comprise the encapsulation material. In particular, the semiconductor free nanoparticles consist of the encapsulation material. Thus, the encapsulated semiconductor nanoparticles comprise the same encapsulation material as the semiconductor free nanoparticles. This is advantageous for the formation of the agglomerate as the formation of the point-to-point connections is facilitated due to the same material on the surface of the encapsulated semiconductor nanoparticles and semiconductor free nanoparticles.

According to at least one embodiment, the encapsulation material comprises silica, titanium oxide, zirconium oxide, alumina, magnesium oxide, hafnia, barium oxide, bismuth oxide, tin oxide or mixed oxides. In particular, the encapsulation material consists of silica, titanium oxide, zirconium oxide, alumina, magnesium oxide, hafnia, barium oxide, bismuth oxide, tin oxide or mixed oxides. Thus, the encapsulation material comprises optically clear metal oxides and the semiconductor structure is therefore particularly well suited for the use in light-emitting devices.

According to at least one embodiment of the semiconductor structure, the agglomerate comprises point-to-point connections between the discrete encapsulated semiconductor nanoparticles and the discrete semiconductor free nanoparticles. These point-to-point connections can be connections between the individual nanoparticles. The point-to-point connections can be non-covalent or covalent interactions between the individual nanoparticles, for example, van der Waals interactions, ionic interactions, hydrogen bridges and/or covalent bonds. Preferably, the point-to-point connections are covalent bonds. For example, if the encapsulation material comprises silica, the point-to-point connections are covalent Si—O bonds. The non-covalent or covalent bonds between the individual nanoparticles lead to an increased stability of the agglomerate.

According to at least one embodiment of the semiconductor structure, a concentration of the discrete semiconductor free nanoparticles in the agglomerate is different than or equal to a concentration of the discrete encapsulated semiconductor nanoparticles. That is to say that the concentration of the semiconductor free nanoparticles can be larger than or equal to or smaller than the concentration of the encapsulated semiconductor nanoparticles. In particular, the concentration of the semiconductor free nanoparticles in the agglomerate is larger than or equal to a concentration of the encapsulated semiconductor nanoparticles. A larger concentration or an equal concentration of the semiconductor free nanoparticles increases the protection of the semiconductor nanoparticles since the semiconductor free nanoparticles contribute to the protection in addition to the encapsulation of the semiconductor nanoparticles.

According to at least one embodiment, the agglomerate comprises a central area and a border area. The central area refers to the part of the agglomerate that is located in the center of the agglomerate and is shielded from the surrounding area by at least one further layer of discrete nanoparticles belonging to the agglomerate. The at least one further layer of discrete nanoparticles is called the border area of the agglomerate. The border area is on the outside of the agglomerate, i.e., it has a boundary surface with the surrounding area. In other words, the border area forms the surface of the agglomerate. In this case, the surface of the agglomerate is not necessarily smooth but, due to the composition of the surface of discrete nanoparticles, may be uneven and rough. The border area surrounds the central area of the agglomerate. On one side, the border area is in direct contact to the central area. On the side facing away from the central area, the border area of the agglomerate is surrounded by the ambient atmosphere.

According to at least one embodiment, a concentration of discrete semiconductor free nanoparticles in the border area is equal to or larger than in the central area. The concentration of semiconductor free nanoparticles in the border area and in the central area may be expressed as a percentage of the overall concentration of nanoparticles in the respective area. Therefore, the concentration of semiconductor free nanoparticles both in the border area and in the central area can be between 0% and 100%. With only encapsulated semiconductor nanoparticles present in the respective area, the concentration of semiconductor free nanoparticles equals 0%. With no encapsulated semiconductor nanoparticles present in the respective area, the concentration of semiconductor free nanoparticles equals 100%. For example, the concentration of semiconductor free nanoparticles in the central area is between 50% and 70%, while the concentration of semiconductor free nanoparticles in the border area is above 70%. Thus, with a higher concentration of semiconductor free nanoparticles in the border area, the number of encapsulated semiconductor nanoparticles on the periphery of the large agglomerate is statistically reduced and, therefore, the encapsulated semiconductor nanoparticles are additionally protected from degradation.

According to at least one embodiment, the discrete semiconductor free nanoparticles are at least partially located in gaps and/or interstices between the discrete encapsulated semiconductor nanoparticles. The arrangement of semiconductor free nanoparticles in gaps and/or interstices in the agglomerate is possible for all sizes of semiconductor free nanoparticles. The smaller the semiconductor free nanoparticles are in comparison to the encapsulated semiconductor nanoparticles, the more likely an arrangement of the semiconductor free nanoparticles in the random gaps and/or interstices becomes. The more of the semiconductor free nanoparticles are located in the random gaps and/or interstices, the more complex and therefore more stable the network constituting the semiconductor structure becomes.

According to at least one embodiment, each of the plurality of discrete semiconductor nanoparticles comprises an additional passivation layer. In particular, the passivation layer is located between the surface of the semiconductor nanoparticle, for example, a quantum dot, and the encapsulation around the semiconductor nanoparticle. The passivation layer may be in direct contact with both the semiconductor nanoparticle and the encapsulation. The passivation layer adds a further protection against degradation for the semiconductor nanoparticles. The passivation layer can, for example, comprise ZnS.

Further embodiments of the invention relate to a method of producing a semiconductor structure. The method described here is preferably used to produce the semiconductor structure described here. Features and embodiments of the method are therefore also disclosed for the semiconductor structure and vice versa.

According to one embodiment of the method of producing a semiconductor structure, the method comprises a preparation of a plurality of discrete semiconductor nanoparticles. The preparation of a plurality of discrete semiconductor nanoparticles, for example, includes a formation of a quantum dot, for example, of a core particle. Optionally, a growth of a shell on the core particle may be included. Optionally, a further application of an additional passivation layer on the outside of the shell is possible.

According to at least one embodiment, the method of producing a semiconductor structure comprises an encapsulation of each of the plurality of discrete semiconductor nanoparticles to form discrete encapsulated semiconductor nanoparticles. Encapsulation is to be understood as the formation of a layer of encapsulation material on the surface of a particle. For example, the semiconductor particles as well as optionally a surfactant are dissolved in a solvent and an encapsulation material or a starting material, for example, monomers, of the encapsulation are added. The encapsulation may be understood as a polymerization of the monomers. If the encapsulation material, for instance, is silica, the monomer may be, for example, a silicate monomer. Optionally, subsequent additions of monomers may be used to increase the amount of encapsulation material on the surface of the semiconductor nanoparticles. The encapsulation material may be in direct contact to the surface of the semiconductor nanoparticle and may be optionally bonded to the semiconductor nanoparticle.

In general, the encapsulation can be performed as follows:
preparing a first solution comprising a semiconductor nanoparticle and a first solvent;
preparing a second solution comprising a surfactant and a second solvent;
adding the first solution and a bifunctional linker to the second solution, thereby preparing a third solution;
adding a catalyst, water and an encapsulation material or a starting material of the encapsulation to the third solution;
thereby preparing an encapsulated semiconductor nanoparticle.

The encapsulation material may comprise or consist of silica, titanium oxide, zirconium oxide, alumina, magnesium oxide, hafnia, barium oxide, bismuth oxide, tin oxide or mixed oxides. The encapsulation may be in direct contact to the surface or the optional passivation layer of the semiconductor nanoparticle. The encapsulation material can surround the semiconductor nanoparticle partially or completely. Preferably, the encapsulation material completely surrounds the semiconductor nanoparticle from all sides.

The encapsulation of discrete semiconductor nanoparticles results in the formation of three-dimensional particles that are not restricted to a specific spatial form. For example, spherical and/or elongated particles are formed. The encapsulated semiconductor nanoparticles are discrete meaning each of the encapsulated semiconductor nanoparticles has a finite size and is generally distinguishable from every other nanoparticle.

According to one embodiment, each semiconductor nanoparticle has its own encapsulation. That is to say that during the encapsulation of the semiconductor nanoparticles, additives are used to ensure the formation of single encapsulated semiconductor nanoparticles. Additives are, for example, surfactants such as, for example, sodium dioctyl sufosuccinate, Igepal or Triton X and bases such as, for example, ammonium hydroxide or mineral bases such as potassium hydroxide or sodium hydroxide in water. Such additives may also help to shape the encapsulation.

According to at least one embodiment, the method comprises the preparation of a plurality of discrete semiconductor free nanoparticles. The preparation of semiconductor free nanoparticles is similar to the encapsulation of semiconductor nanoparticles. To nucleate semiconductor free nanoparticles, a nucleation site other than the semiconductor nanoparticles may be necessary. For this purpose, a precursor, for example, an alkoxy metal precursor may be used. This precursor can be identical to the starting material, for example, a monomer, of the encapsulation material. Subsequently, this precursor reacts with further molecules of the starting material of the encapsulation material. A semiconductor free nanoparticle is formed, in which the precursor becomes part of the encapsulation material.

The preparation of a plurality of discrete semiconductor free nanoparticles results in the formation of three-dimensional particles that are not restricted to a specific spatial form. For example, spherical and/or elongated particles can be formed. The prepared semiconductor free nanoparticles are discrete meaning each of the semiconductor free nanoparticles has a finite size and is distinguishable from every other nanoparticle.

According to at least one embodiment, the method comprises the condensation of the plurality of discrete encapsulated semiconductor nanoparticles and the plurality of discrete semiconductor free nanoparticles to form an agglomerate. The formation of the agglomerate can be described as an association of the discrete nanoparticles. The association of the discrete nanoparticles may be formed via point-to-point connections between the individual discrete nanoparticles. In other words, the associated or agglomerated nanoparticles form a network.

A condensation is to be understood as a chemical reaction that connects at least two reactants while eliminating water or some other small molecules. The condensation of the plurality of nanoparticles leads to the formation of point-to-point connections between the discrete nanoparticles. For example, point-to-point connections between the encapsulated semiconductor nanoparticles and semiconductor free nanoparticles are formed. In this case, a condensation of the encapsulated semiconductor nanoparticles and the semiconductor free nanoparticles is carried out. The point-to-point connections formed during condensation can be non-covalent or covalent bonds. In particular, covalent bonds between the discrete nanoparticles are formed.

In particular, the condensation of encapsulated semiconductor nanoparticles and semiconductor free nanoparticles leads to an increased stability of the agglomerate constituting the semiconductor structure as can be seen, for example, in FIG. 5, which will be discussed later on. The stability can be particularly increased, if small semiconductor free nanoparticles are arranged in some of the random gaps and interstices in the agglomerate. Small semiconductor free nanoparticles means that the semiconductor free nanoparticles are smaller than the encapsulated semiconductor nanoparticles used to form the agglomerate. In this case, the small semiconductor free nanoparticles are arranged in some of the random gaps and/or interstices in the agglomerate attaining a more complex and therefore more stable network.

The presence of the semiconductor free nanoparticles in the agglomerate provides a further barrier for the protection of the semiconductor nanoparticles additionally to the encapsulation of the semiconductor nanoparticles. The agglomerate comprises a central area and a border area with the central area being located in the center of the agglomerate and being shielded from the surrounding area by at least one further layer of discrete nanoparticles belonging to the agglomerate called the border area. The concentration of semiconductor free nanoparticles in the border area may be equal to or larger than in the central area, and thus also influencing the number of encapsulated semiconductor nanoparticles in the respective areas. In particular, in the condensed structure, the number of encapsulated semiconductor nanoparticles in the border area of the agglomerate can be statistically reduced. Since the border area of the agglomerate is more exposed to ambient conditions than the central area of the agglomerate a reduction of the number of encapsulated semiconductor nanoparticles in the border area of the agglomerate lowers degradation of the semiconductor structure.

The number of encapsulated semiconductor nanoparticles in the border area of the agglomerate can be influenced during the formation of the agglomerate since a statistical reduction may be insufficient. To reduce the number of encapsulated semiconductor nanoparticles in the border area of the agglomerate, i.e., to increase the concentration of semiconductor free nanoparticles in the border area, for example, the agglomerate may be formed stepwise. Firstly, an agglomerate of encapsulated semiconductor nanoparticles can be formed. Subsequently, a layer of semiconductor free nanoparticles can be applied on the surface of the firstly formed agglomerate of encapsulated semiconductor nanoparticles. Thus, the central area of the formed agglomerate can comprise the encapsulated semiconductor nanoparticles while in the border area the semiconductor free nanoparticles efficiently shield the semiconductor nanoparticles from degradation.

Optionally, the encapsulated semiconductor nanoparticles can be treated with multiple rounds of semiconductor free nanoparticles to build up more complex networks. As a result, the border area comprises multiple layers of mainly semiconductor free nanoparticles and, thus, is thicker than a border area comprising only one layer of mainly semiconductor free nanoparticles. The thicker border area better protects the encapsulated semiconductor nanoparticles located mainly in the central area.

Alternatively, a gradient of the concentration of semiconductor free nanoparticles may be formed in the agglomerate as well as in each the border area and in the central area of the agglomerate. For example, in the beginning of the agglomeration process, no or only a small amount of semiconductor free nanoparticles can be added to the encapsulated semiconductor nanoparticles. During the agglomeration process, the amount of semiconductor free nanoparticles added to the reaction solution can be increased. The agglomerate may than contain only a small amount of semiconductor free nanoparticles in the central area and a high amount of semiconductor free nanoparticles in the border area. Thus, the concentration of semiconductor free nanoparticles may gradually increase from the center of the agglomerate to the surface of the agglomerate and therefore may form a gradient.

Alternatively, semiconductor free nanoparticles can be pre-aggregated into small agglomerates containing only a few nanoparticles each. For example, the small agglomerates can contain up to 10 semiconductor free nanoparticles. Subsequently, the small agglomerates can be exposed to encapsulated semiconductor nanoparticles. Thus, a large agglomerate with thicker layers of semiconductor free nanoparticles around the encapsulated semiconductor nanoparticles is formed, therefore better protecting the semiconductor nanoparticles from degradation.

Alternatively or additionally, it is possible to pretreat the encapsulated semiconductor nanoparticles with a strong base to activate their surface towards reacting with incoming semiconductor free nanoparticles. This increases the bonding between the encapsulated semiconductor nanoparticles and the semiconductor free nanoparticles and decreases the self-agglomeration of the encapsulated semiconductor nanoparticles. In the formed agglomerate, therefore, the encapsulated semiconductor nanoparticles are spaced further apart and are, for example, surrounded by semiconductor free nanoparticles and thus better protected from degradation.

According to one embodiment, the stability of the formed agglomerate can be influenced during condensation. The stability of the agglomerate may be closely linked to the network formed in the agglomerate. For example, compact or extended networks can be formed. For instance, compact networks may have less random gaps and/or interstices while extended networks may have more random gaps and/or interstices. Parameters influencing whether a compact or an extended network is formed within the agglomerate are, for example, the pH value of the reaction suspension and the size of the reacting nanoparticles.

For example, the pH value of the reaction suspension of encapsulated semiconductor nanoparticles and semiconductor free nanoparticles can be adjusted to favor either compact or extended networks. For example, pH values below 7 can favor the formation of extended networks.

Alternatively, a mixture of different sizes of semiconductor nanoparticles and semiconductor free nanoparticles can be used to form the agglomerate. For example, both small and large semiconductor free nanoparticles may be used at the same time to form a more compact network with the small semiconductor free nanoparticles arranged in some of the random gaps and/or interstices while the larger semiconductor free nanoparticles are more likely to form a protective layer on the outside of the agglomerate. Furthermore, different sizes of semiconductor free nanoparticles may be added stepwise to the reaction suspension comprising semiconductor nanoparticles to distinctly determine the compactness of each part of the agglomerate.

According to at least one embodiment of the method of producing a semiconductor structure, the encapsulation of the discrete semiconductor nanoparticles and the preparation of the discrete semiconductor free nanoparticles is performed consecutively or simultaneously. A consecutive encapsulation of the semiconductor nanoparticles and preparation of the semiconductor free nanoparticles means that both method steps can be performed independently of one another. For example, the encapsulation of the semiconductor nanoparticles is performed before the preparation of the semiconductor free nanoparticles or vice versa. In particular, the encapsulation of the semiconductor nanoparticles can be performed at the same time as the preparation of the semiconductor free nanoparticles but in different reaction vessels. Therefore, the properties of both the encapsulated semiconductor nanoparticles and the semiconductor free nanoparticles can be customized independently of one another. For example, both the size and the surface characteristics of the nanoparticles can be customized.

A simultaneous encapsulation of the semiconductor nanoparticles and preparation of the semiconductor free nanoparticles means that both method steps can be performed in one step. The preparation of the semiconductor free nanoparticles can then be performed in situ with the encapsulation of the semiconductor nanoparticles. In particular, the preparation of the semiconductor free nanoparticles and the encapsulation of the semiconductor nanoparticles can be performed in the same reaction vessel. This process can be called a co-generation. To co-generate semiconductor free nanoparticles while encapsulating semiconductor nanoparticles, a precursor may be used to nucleate semiconductor free nanoparticles.

During the simultaneous encapsulation of the semiconductor nanoparticles and preparation of the semiconductor free nanoparticles, a variety of factors may be varied to tune the reactivity to result in the desired proportion of semiconductor free nanoparticles and encapsulated semiconductor nanoparticles. Factors can be, for example, the concentration of semiconductor nanoparticles in the reaction solution and/or the amount of the encapsulation material or starting material, for example, monomers, of the encapsulation added to the reaction solution and/or the pH value of the reaction solution. To shift the proportion of semiconductor free nanoparticles and encapsulated semiconductor nanoparticles in favor of the encapsulated semiconductor nanoparticles, for example, the concentration of semiconductor nanoparticles added to the reaction solution can be increased. Thus, more encapsulated semiconductor nanoparticles and less semiconductor free nanoparticles may be formed. To shift the proportion of semiconductor free nanoparticles and encapsulated semiconductor nanoparticles in favor of the semiconductor free nanoparticles, for example, the concentration of the semiconductor nanoparticles in the reaction solution can be decreased and/or the amount of monomer added to the reaction solution can be increased and/or the pH value of the reaction solution can be increased. For example, a higher pH value results in faster hydrolysis and favors non-templated nucleation. Alternatively or additionally, a more reactive encapsulation material can be used. Thus, more semiconductor free nanoparticles and less encapsulated semiconductor nanoparticles may be formed.

According to at least one embodiment of the method of producing a semiconductor structure, during the preparation of the discrete semiconductor free nanoparticles, parameters are variable, wherein the parameters comprise charge, surfactant coating and degree of gelation. With varying these parameters, the properties of the semiconductor free nanoparticles can be customized. In particular, the parameters may be varied during the preparation of the semiconductor free nanoparticles without the simultaneous encapsulation of semiconductor nanoparticles to achieve improved starting conditions for the agglomeration. For example, the semiconductor free nanoparticles might be prepared so as to present a high degree of negative surface charge to discourage mutual coalescence and encourage heterogeneous interaction between different nanoparticles as, for example, between the semiconductor free nanoparticles and the encapsulated semiconductor nanoparticles. A surfactant coating of the encapsulated semiconductor free nanoparticles can, for example, retard the agglomeration process, while an increased gelation can, for instance, promote agglomeration. Gelation is to be understood as promoting inter-particle interactions by collecting and/or linking particles around pockets of solvent.

According to at least one embodiment, the discrete semiconductor free nanoparticles are prepared using an oxide precursor to nucleate nanoparticles. For instance, a highly reactive oxide precursor can be used which does not require templating on a nanoparticle surface in order to nucleate semiconductor free nanoparticles. According to one embodiment, the oxide precursor is an alkoxy metal precursor. Suitable precursor reagents can, for example, include tetramethoxysilane, tetraethoxysilane (tetraethylorthosilicate) and longer variants, aluminum-tri-sec-butoxide or aluminum isopropoxide. These precursor reagents are single molecules and not bulk structures. Other precursors are possible as well. In particular, the alkoxy metal precursor can be a molecule of the starting material, for example, a monomer, of the encapsulation material, for example, tetraethylorthosilicate.

Other embodiments relate to a light-emitting device. The light-emitting device described here preferably contains the semiconductor structure described here which is preferably produced with the method described here. Features and embodiments of the light-emitting device are therefore also disclosed for the semiconductor structure and the method of producing a semiconductor structure and vice versa.

According to one embodiment of the light-emitting device, the light-emitting device comprises an active layer stack which is designed to emit electromagnetic radiation. The active layer stack may have an active area that is designed to generate electromagnetic radiation during operation of the light-emitting device. The electromagnetic radiation generated in the active area is emitted from a radiation emission surface of the active layer stack forming a radiation beam. The electromagnetic radiation emitted from the active layer stack is called a primary radiation. In particular, the primary radiation forms the radiation beam.

According to at least one embodiment, the light-emitting device further comprises a conversion element in the radiation beam of the active layer stack, wherein the conversion element comprises a phosphor material and a matrix. In particular, the phosphor material comprises a downconverter material. The matrix, for example, comprises or consists of a polymer such as silicone. Alternatively, the matrix can comprise or consist of silica. The phosphor material may then be suspended in a liquid silica suspension or a liquid solution of molecular silica precursors. Subsequently, the silica matrix may be condensed/polymerized, entrapping the phosphor material. If the phosphor material is encapsulated in silica, the matrix and the encapsulated phosphor material might be fused into a single structure with no clear boundary.

According to at least one embodiment, the phosphor material comprises a semiconductor structure comprising an agglomerate of discrete encapsulated semiconductor nanoparticles and discrete semiconductor free nanoparticles. In particular, the phosphor material consists of the semiconductor structure comprising an agglomerate of discrete encapsulated semiconductor nanoparticles and discrete semiconductor free nanoparticles.

According to one embodiment, the semiconductor nanoparticles in the phosphor material convert the wavelength of electromagnetic radiation which passes through at least part of the conversion element. The incident primary radiation of a first wavelength range is converted in electromagnetic radiation of a second wavelength range. The second wavelength range preferably comprises longer wavelengths than the primary radiation.

Using the semiconductor structure described here in a conversion element is beneficial due to the high amount of semiconductor free nanoparticles in the border area of the agglomerate. The improved protection of the semiconductor nanoparticles leads to a better aging behavior of the phosphor material under harsh conditions, for example, at higher powers or higher humidity.

According to at least one embodiment, each of the discrete encapsulated semiconductor nanoparticles comprises a quantum dot and an encapsulation comprising an encapsulation material. Each quantum dot may, for example, comprise a core comprising a first semiconductor material and, optionally, at least one shell comprising a second different semiconductor material with the shell at least partly, preferably completely, surrounding the core. Each semiconductor nanoparticle may be encapsulated in an encapsulation material. That is to say that the encapsulation material may be in direct contact to the quantum dot and surrounds the semiconductor nanoparticles at least partially, preferably completely. In particular, each semiconductor nanoparticles can feature its own encapsulation.

According to at least one embodiment, the discrete semiconductor free nanoparticles comprise the encapsulation material. In particular, the semiconductor free nanoparticles consist of the encapsulation material. "Semiconductor free" means that no semiconductor nanoparticles are present in the semiconductor free nanoparticles.

According to at least one embodiment, the encapsulation material comprises silica, titanium oxide, zirconium oxide, alumina, magnesium oxide, hafnia, barium oxide, bismuth oxide, tin oxide or mixed oxides. In particular, the encapsulation material consists of silica, titanium oxide, zirconium oxide, alumina, magnesium oxide, hafnia, barium oxide, bismuth oxide, tin oxide or mixed oxides.

According to at least one embodiment, each of the plurality of discrete encapsulated semiconductor nanoparticles comprises an additional passivation layer. The additional passivation layer is located on the surface of the semiconductor nanoparticle, for example, a quantum dot. In particular, the passivation layer is located between the surface of the semiconductor nanoparticle and the encapsulation around the semiconductor nanoparticle. The passivation layer may be in direct contact with both the surface of the semiconductor nanoparticle and the encapsulation. The passivation layer adds a further protection against degradation of the semiconductor nanoparticles.

BRIEF DESCRIPTION OF THE DRAWINGS

Advantageous embodiments and developments of the semiconductor structure, the method of producing a semiconductor structure and the light-emitting device will become apparent from the exemplary embodiments described below in association with the figures.

In the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1A:
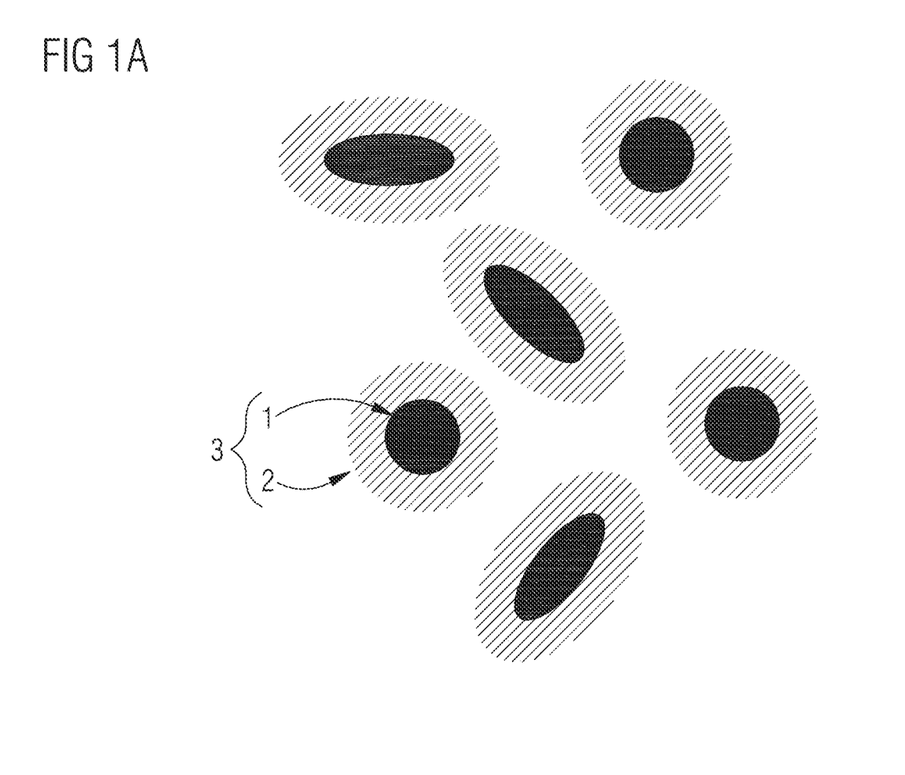
FIGS. 1A and 1B show a schematic illustration of encapsulated semiconductor nanoparticles and a semiconductor structure according to a reference example.
Figure 1B:
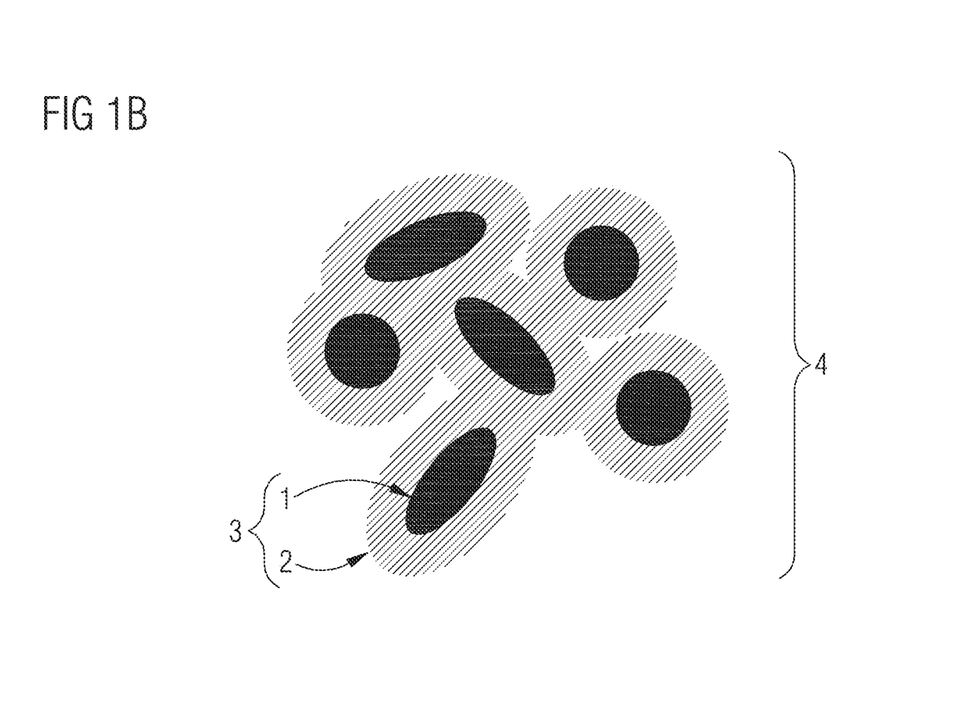

FIGS. 1A and 1B show a plurality of encapsulated semiconductor nanoparticles 3 forming an agglomerate constituting a semiconductor structure 4 according to a reference example.

In FIG. 1A, a plurality of encapsulated semiconductor nanoparticles 3 prior to agglomeration is shown. Each encapsulated semiconductor nanoparticle 3 comprises a semiconductor nanoparticle 1 and an encapsulation 2. Each of the encapsulated semiconductor nanoparticles 3 is discrete meaning finite in size and distinguishable from every other encapsulated semiconductor nanoparticle 3. The semiconductor nanoparticle 1 can, for example, be a quantum dot. The encapsulation material of the encapsulation 2 can, for example, be silica.

In FIG. 1B, a semiconductor structure 4 is shown. The semiconductor structure 4 is an agglomerate of the encapsulated semiconductor nanoparticles 3. The encapsulated semiconductor nanoparticles 3 are connected via point-to-point connections forming a network of the encapsulated semiconductor nanoparticles 3.

Figure 2A:
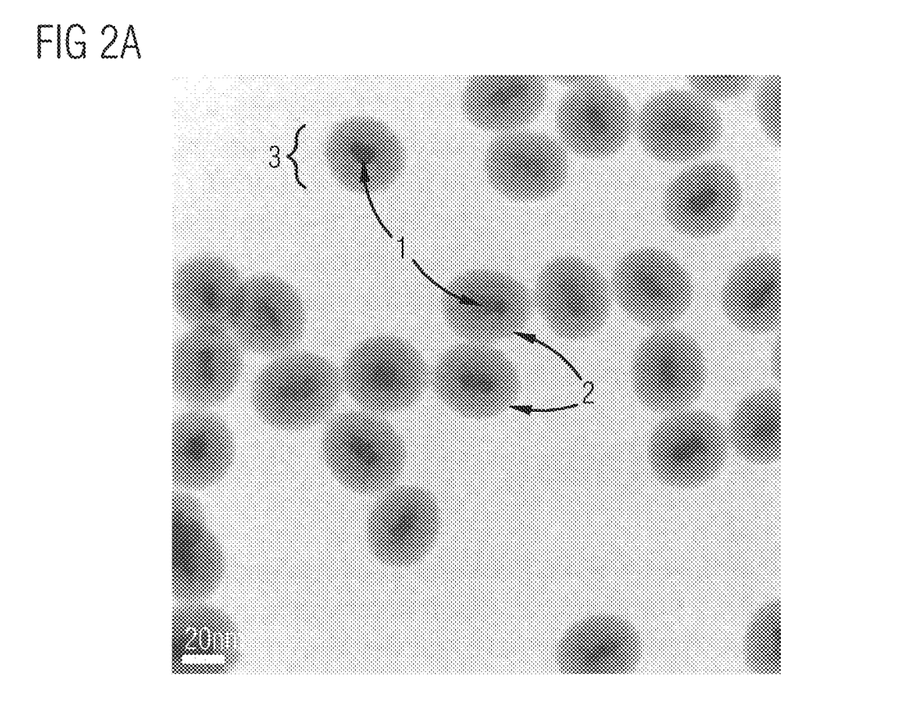
FIG. 2A to 2C show transmission electron microscope (TEM) images of encapsulated semiconductor nanoparticles and a semiconductor structure according to a reference example.
Figure 2B:
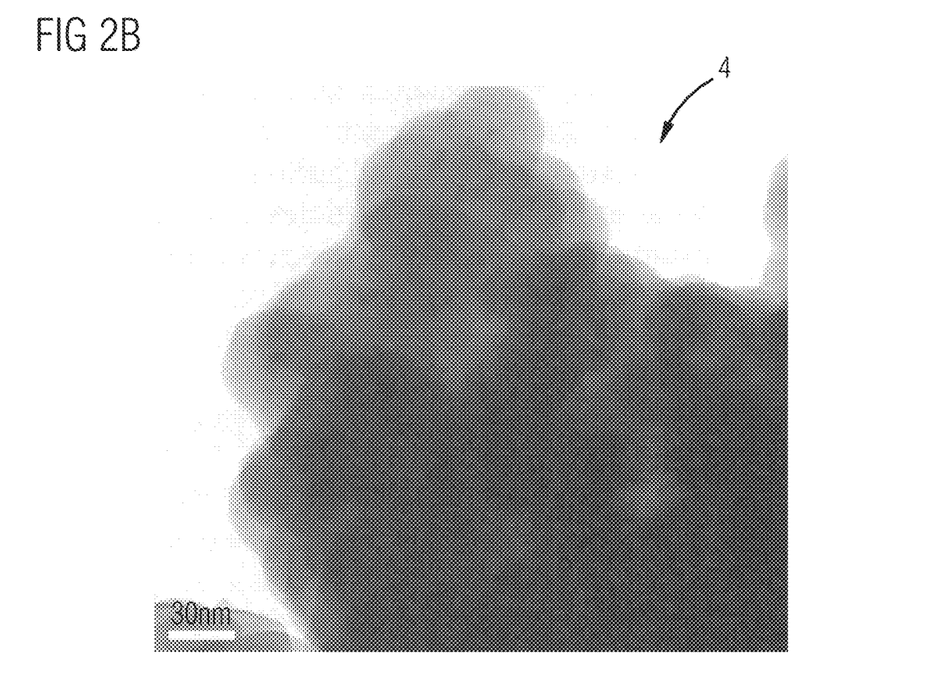
Figure 2C:
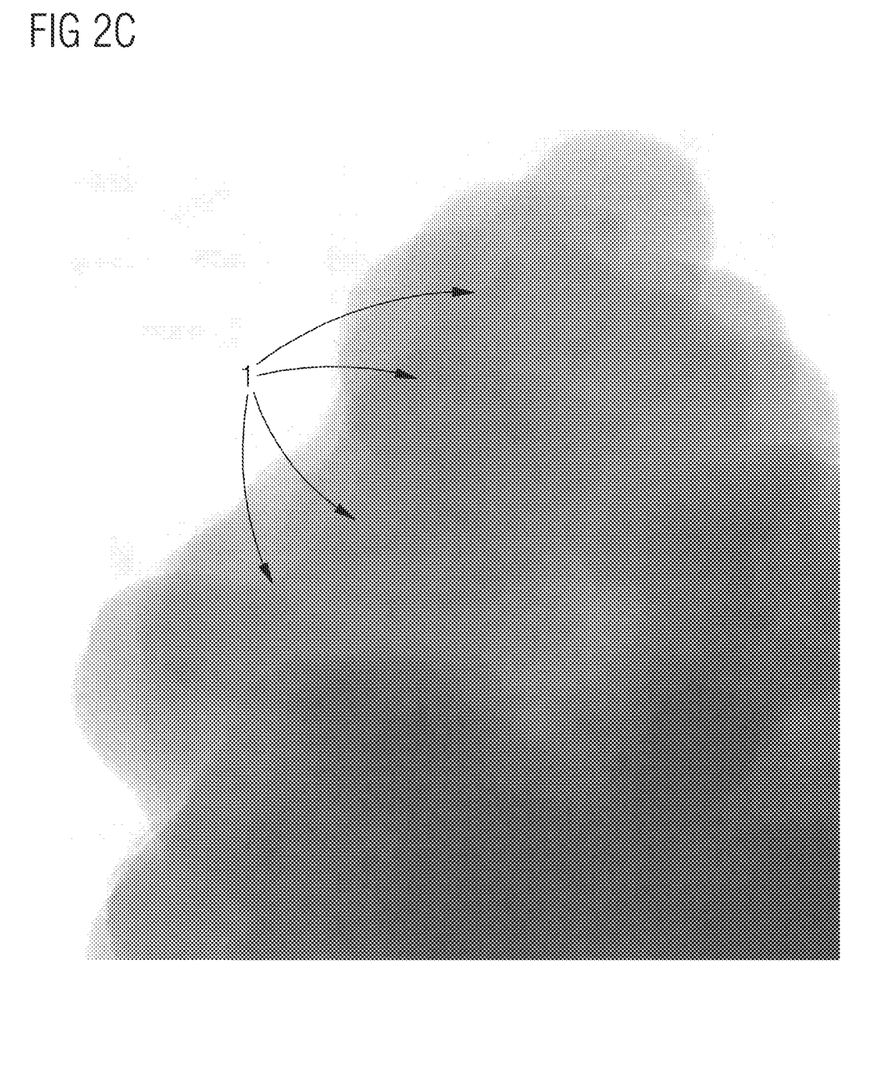

FIG. 2A to 2C show transmission electron microscope (TEM) images of encapsulated semiconductor nanoparticles 3 and a semiconductor structure 4 according to the reference example.

FIG. 2A shows a plurality of encapsulated semiconductor nanoparticles 3 prior to agglomeration. Each encapsulated semiconductor nanoparticles 3 is discrete and not bonded to any other encapsulated semiconductor nanoparticle 3 by point-to-point connections.

FIG. 2B shows a TEM image of a semiconductor structure 4, with an enlargement of the border area of the semiconductor structure 4 in FIG. 2C. The semiconductor structure 4 features a high amount of thinly coated semiconductor nanoparticles 1 on the outside and around the periphery of the agglomerate as indicated in FIG. 2C, which leaves these particles more susceptible to degradation.

Figure 3A:
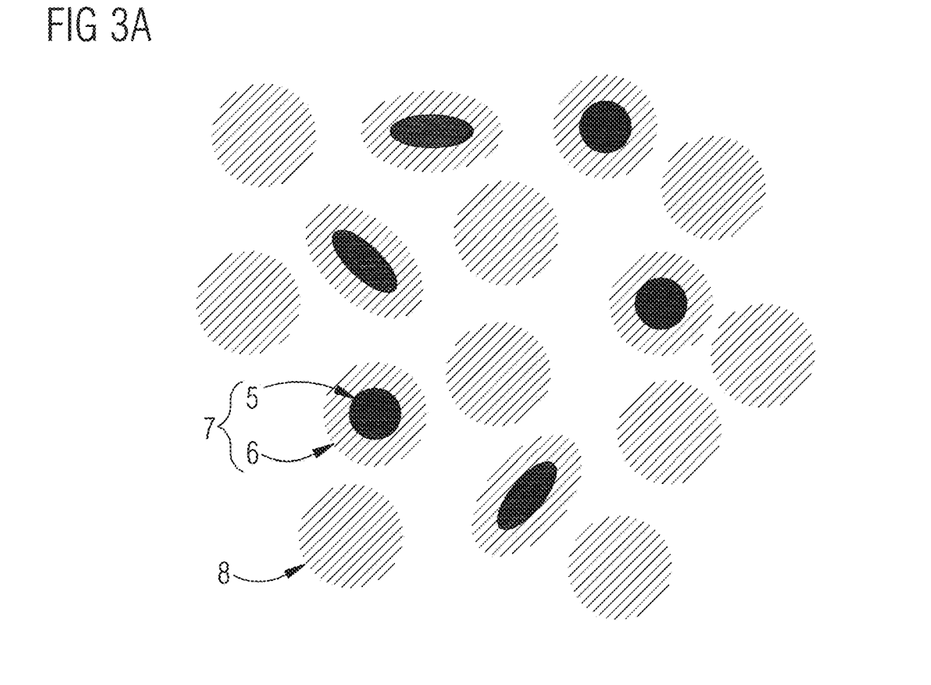
FIGS. 3A and 3B show a schematic illustration of encapsulated semiconductor nanoparticles and semiconductor free nanoparticles according to one embodiment and a semiconductor structure according to one embodiment.
Figure 3B:
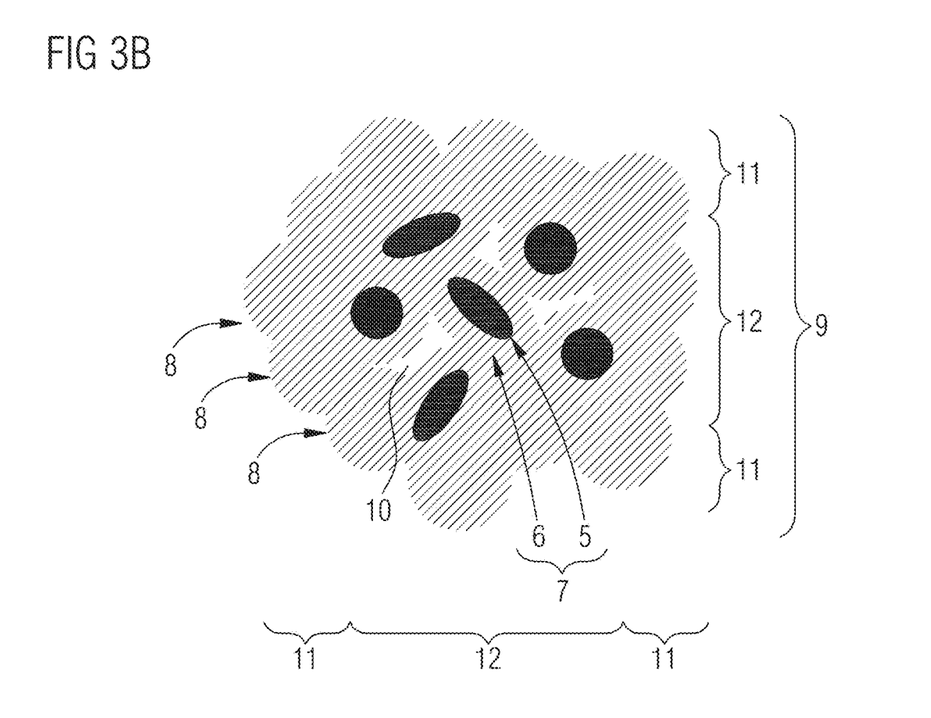

FIGS. 3A and 3B show a plurality of encapsulated semiconductor nanoparticles 7 and semiconductor free nanoparticles 8 according to one embodiment and a semiconductor structure 9 according to one embodiment.

In FIG. 3A, a plurality of encapsulated semiconductor nanoparticles 7 and semiconductor free nanoparticles 8 are shown prior to agglomeration. Both the encapsulated semiconductor nanoparticles 7 and the semiconductor free nanoparticles 8 are discrete. That is to say that they are finite in size and distinguishable from one another and each other. The encapsulated semiconductor nanoparticles 7 each comprise a semiconductor nanoparticle 5 and an encapsulation 6. The semiconductor nanoparticle 5 can, for example, be a quantum dot. The encapsulation material of the encapsulation 6 can be, for example, silica. The semiconductor free nanoparticles 8 are free of semiconductor nanoparticles. Preferably, the semiconductor nanoparticles 8 comprise or consist of the encapsulation material of the encapsulation 6 of the encapsulated semiconductor nanoparticles 7. For example, the semiconductor free nanoparticles 8 comprise or consist of silica.

In FIG. 3B, a semiconductor structure 9 is shown. The semiconductor structure 9 is formed via condensation of both the encapsulated semiconductor nanoparticles 7 and the semiconductor free nanoparticles 8. The condensation reaction leads to the formation of point-to-point connections between the encapsulated semiconductor nanoparticles 7 and the semiconductor free nanoparticles 8 as well as between the nanoparticles 7, 8 of the same species. The semiconductor structure 9 can be described as an agglomerate or a network of the encapsulated semiconductor nanoparticles 7 and the semiconductor free nanoparticles 8. In the semiconductor structure 9, the individual spatial form of each nanoparticle 7, 8 can be recognized. Random gaps and/or interstices 10 are formed in between at least two nanoparticles 7, 8. The semiconductor structure 9 has a central area 12 and a border area 11. The border area 11 surrounds the central area 12 and forms a layer on the central area 12 having a thickness of at least one nanoparticle 7, 8. The border area 11 can comprise a higher concentration of semiconductor free nanoparticles 8 than of the encapsulated semiconductor nanoparticles 7. Thus, a protective layer of semiconductor free nanoparticles 8 is formed in the border area 11 of the semiconductor structure 9. The central area 12 may than comprise encapsulated semiconductor nanoparticles 7 that are protected against degradation by the border area 11.

Figure 4A:
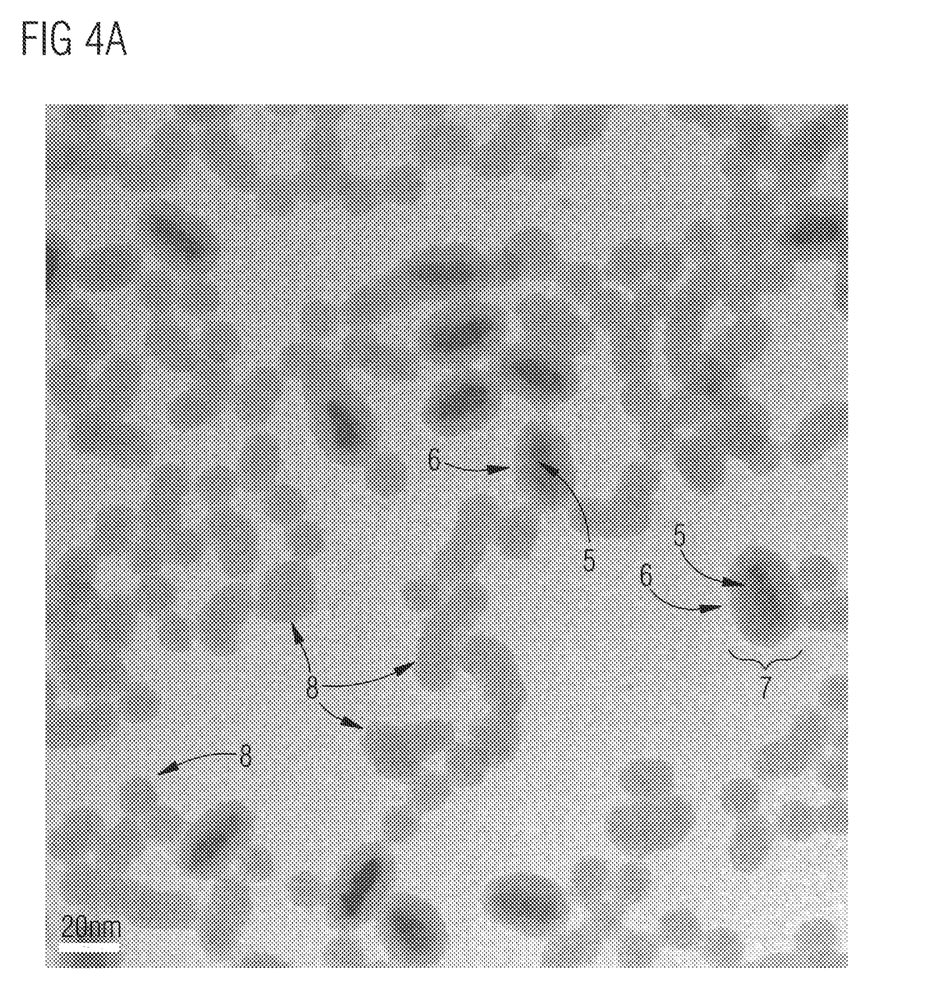
FIGS. 4A and 4B show TEM images of encapsulated semiconductor nanoparticles and semiconductor free nanoparticles according to one embodiment and a semiconductor structure according to one embodiment.
Figure 4B:
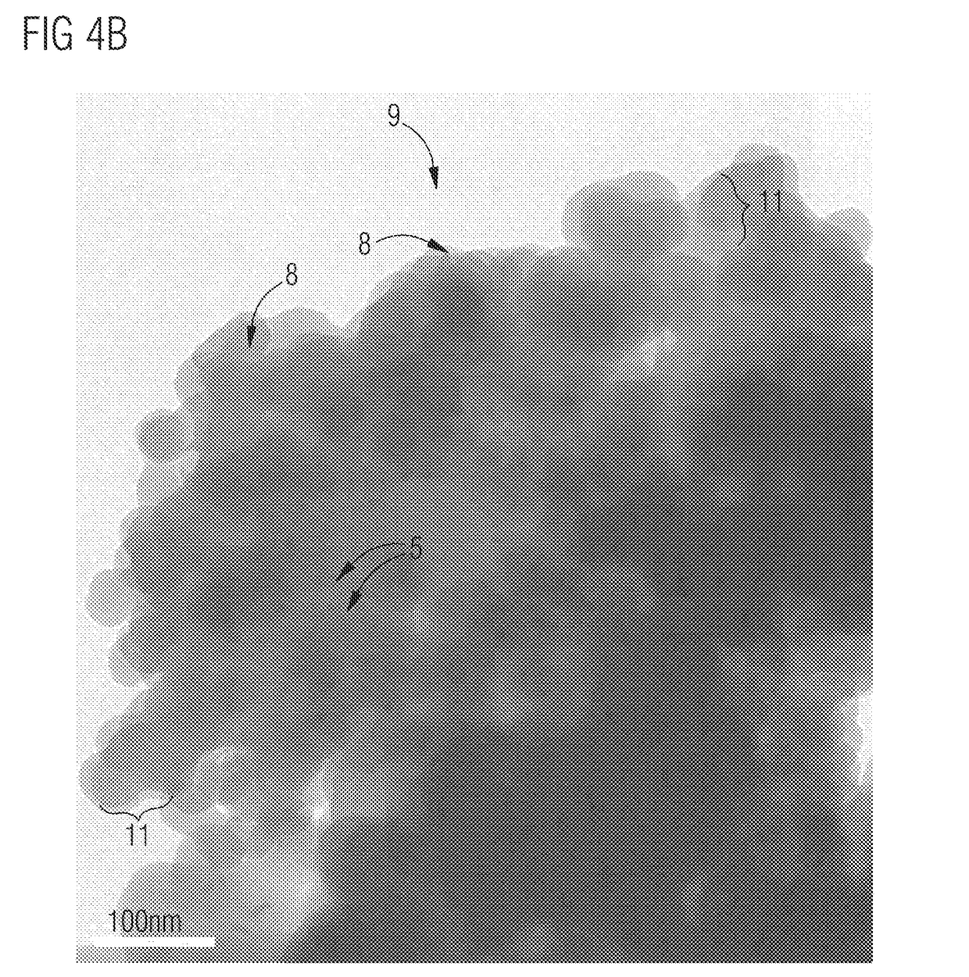

FIGS. 4A and 4B show transmission electron microscope (TEM) images of encapsulated semiconductor nanoparticles 7 and semiconductor free nanoparticles 8 according to one embodiment and a semiconductor structure 9 according to one embodiment.

In FIG. 4A, a TEM image of the result of an in situ co-generation of encapsulated semiconductor nanoparticles 7 and semiconductor free nanoparticles 8 is shown. In situ means that the reactions forming the encapsulation 6 around the semiconductor nanoparticles 5 comprising a CdSe core, a CdS shell and an optional ZnS passivation layer, and generating the semiconductor free nanoparticles 8 are performed in the same reaction vessel. The material for the encapsulation 6 and the semiconductor free nanoparticles 8 comprises silica. As can be seen, a plurality of semiconductor free nanoparticles 8 is formed as well as an encapsulation 6 for the semiconductor nanoparticles 5 forming the encapsulated semiconductor nanoparticles 7.

In FIG. 4B, a TEM image of a semiconductor structure 9 is shown. The semiconductor structure 9 contains encapsulated semiconductor nanoparticles 7 and semiconductor free nanoparticles 8. The semiconductor structure 9 is the result of a condensation of encapsulated semiconductor nanoparticles 7 and semiconductor free nanoparticles 8. As can be seen, a high amount of semiconductor free nanoparticles 8 is arranged in the border area 11 of the semiconductor structure 9. The semiconductor nanoparticles 5 are thus better protected from the ambient atmosphere.

A semiconductor structure can be produced, for example, according to following exemplary embodiment:

The plurality of discrete semiconductor nanoparticles 5 comprising a CdSe core, a CdS shell and an optional ZnS passivation layer were prepared as follows: Cadmium oxide is dissociated in the presence of octadecylphosphonic acid and the mixed solvent system trioctylphosphine oxide/trioctylphosphine at 280° C. under argon atmosphere. The system is cooled to 120° C. and degassed under vacuum before heating the reaction to 360° C. for particle formation. Elemental selenium dissolved in trioctylphosphine is rapidly injected to induce nucleation of the CdSe nanoparticles. Aliquots are regularly withdrawn from the resulting reaction mixture and analyzed by UV-Vis absorption until the desired particle color is achieved, typically around 560 nm at the lowest energy absorption feature.

For the CdS shell growth on the CdSe nanoparticles, cadmium oxide is dissociated in the presence of the surfactants octadecylphosphonic acid and hexylphosphonic acid and the same phosphine-based mixed solvent system and 280° C. under argon atmosphere. The dissociated cadmium solution is similarly cooled, degassed, and heated to 320° C. Elemental sulfur dissolved in trioctylphosphine along with CdSe nanoparticles dispersed in toluene are injected into the reaction solution. Aliquots are withdrawn at regular intervals and the reaction is quenched by cooling to room temperature once the desired final color is reached, typically with an emission maximum around 625 nm.

To apply an optional additional passivation layer of ZnS, zinc acetate, octadecylamine, and oleic acid are added to a trioctylphosphine oxide solvent which is then degassed under vacuum at 120° C. until a clear solution is obtained. The reaction mixture is heated to 235° C. under argon atmosphere. The CdS-passivated CdSe nanoparticles are dispersed in trioctylphosphine along with elemental sulfur and the solution is injected into the hot Zn-containing reaction. Heating is continued for 3 to 4 hours until peak quantum efficiency is obtained. These particles as well as CdSe and CdSe/CdS particles are similarly isolated from their respective reaction solutions by addition of toluene to the cooled solutions and flocculation of the particles via addition of an alcoholic non-solvent such as 2-propanol.

The semiconductor nanoparticles 5 were encapsulated as follows: The surfactant Igepal CO-520 is dissolved in cyclohexane. With constant stirring, semiconductor nanoparticles dispersed at nearly saturated concentration in cyclohexane are added to the mixture along with neat cyclohexane. Aminopropyltrimethoxysilane is added to the solution and allowed to incubate with the particles. Ammonium hydroxide (28% w/w) and tetraethylorthosilicate are added. Subsequent hourly additions of tetraethylorthosilicate are optionally included to increase the amount of silica coated onto the nanoparticles. Typically, the reaction is allowed to stir overnight prior to purification which consists of repeated suspension and centrifugal isolation of the particles from toluene, methanol and/or 2-propanol.

The semiconductor free nanoparticles 8 are prepared as described above for the encapsulation of semiconductor nanoparticles 5 with the exception that no semiconductor nanoparticles 5 are added to the reaction mixture. All other conditions are identical.

The in situ preparation of semiconductor free nanoparticles 8 with the encapsulation of semiconductor nanoparticles 5 is carried out as described above for the encapsulation of semiconductor nanoparticles 5. In order to generate semiconductor free nanoparticles 8 in situ, the reaction needs to be changed to enhance self-nucleation in addition to encapsulate the semiconductor nanoparticles. This can be done, for example, by greatly reducing the semiconductor nanoparticle to encapsulation material ratio or by using a more reactive encapsulation material.

The encapsulated semiconductor nanoparticles 7 and the semiconductor free nanoparticles 8 were condensed to form an agglomerate 9 as described above for the encapsulation of semiconductor nanoparticles 5: Equal volumes of semiconductor free nanoparticles 8 and encapsulated semiconductor nanoparticles 7 suspended in toluene at identical concentrations are combined. Igepal CO-520 and aqueous ammonium hydroxide are added followed by tetraethylorthosilicate. All ratios are approximately the same as those described above and particles are similarly washed and isolated.

Figure 5:
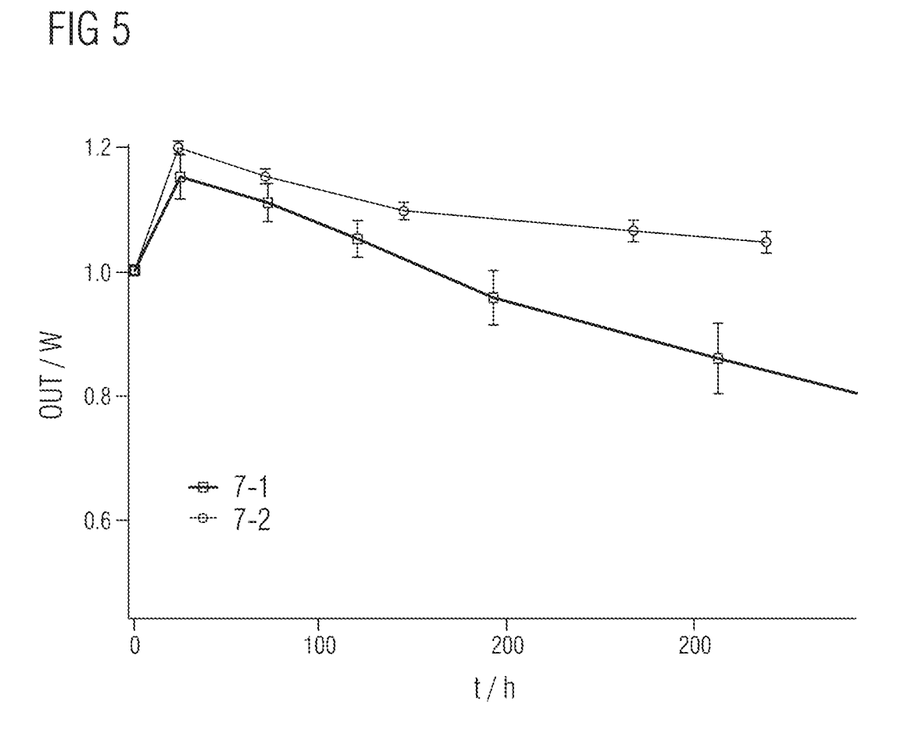
FIG. 5 shows curves for wet high temperature operating life (WHTOL)

FIG. 5 shows wet high temperature operating life (WH-TOL) curves for accelerated aging of samples of semiconductor structures carried out at 85° C. with 85% relative humidity in silicone-cured OSRAM 3030 LED packages driven at 65 mA. On the y-axis, the down converted normalized red output (OUT) in Watts is shown. On the x-axis, the exposure time t in hours is shown. Curve 7-1 shows the output as a function of exposure time for a light-emitting diode containing a semiconductor structure 4 comprising encapsulated semiconductor nanoparticles 3. Curve 7-2 shows the output as a function of exposure time for a light-emitting diode containing a semiconductor structure 9 according to one embodiment comprising encapsulated semiconductor nanoparticles 7 and semiconductor free nanoparticles 8. The persistence of the red output of the light-emitting diode containing the semiconductor structure 9, in particular, for long exposure times can be observed. Even at very short exposure times, the semiconductor structure 9 prepared by the method described here is clearly more robust in this challenge.

Figure 6:
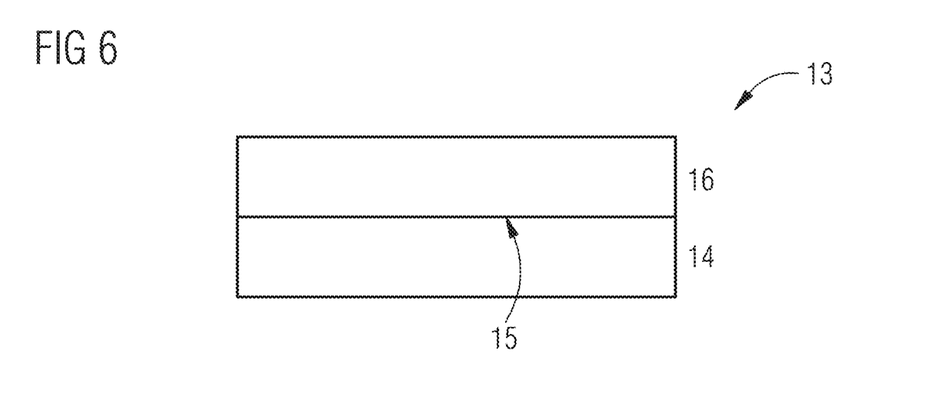
FIG. 6 shows a schematic illustration of a light-emitting device according to one embodiment.

FIG. 6 shows a schematic illustration of a light-emitting device 13 according to one embodiment. The light-emitting device 13 comprises an active layer stack 14 which is designed to emit electromagnetic radiation. The active layer stack 14 comprises a radiation emission surface 15. The electromagnetic radiation emitted from the radiation emission surface 15 forms the radiation beam. A conversion element 16 is arranged in the radiation beam of the active layer stack 14. In other words, the conversion element 16 is arranged above the active layer stack 14 in such a way that the radiation beam passes through at least a part of the conversion element 16. The conversion element 16 can be in direct contact to the active layer stack 14, preferably to the radiation emission surface 15, or the conversion element 16 and the active layer stack 14 can be spaced apart (not shown here). That is to say that other layers or spaces can be located between the active layer stack 14 and the conversion element 16.

The conversion element 16 is designed to convert the wavelength of the electromagnetic radiation emitted from the active layer stack 14. In particular, the conversion element 16 absorbs the incident electromagnetic radiation and reemits electromagnetic radiation with a different, preferably longer, wavelength.

The conversion element 16 comprises a phosphor material and a matrix. The matrix can comprise or consist of silicone. The phosphor material is designed to absorb electromagnetic radiation and reemit electromagnetic radiation. The phosphor material can comprise or consist of the semiconductor structure 9 comprising an agglomerate of encapsulated semiconductor nanoparticles 7 and semiconductor free nanoparticles 8. In particular, the semiconductor nanoparticles 5 can be quantum dots.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. A semiconductor structure comprising:
   a plurality of discrete encapsulated semiconductor nanoparticles; and
   a plurality of discrete semiconductor free nanoparticles,
   wherein the discrete encapsulated semiconductor nanoparticles and the discrete semiconductor free nanoparticles form an agglomerate,
   wherein the discrete encapsulated semiconductor nanoparticles and the discrete semiconductor free nanoparticles have a similar size and a similar shape, wherein each of the discrete encapsulated semiconductor nanoparticles comprises a quantum dot and an encapsulation comprising an encapsulation material,
wherein the discrete semiconductor free nanoparticles comprise the encapsulation material,
wherein the agglomerate comprises point-to-point connections between the discrete encapsulated semiconductor nanoparticles and the discrete semiconductor free nanoparticles,
wherein the encapsulation material comprises silica, and wherein the point-to-point connections are covalent Si—O bonds.

2. The semiconductor structure according to claim 1, wherein the encapsulation material further comprises titanium oxide, zirconium oxide, alumina, magnesium oxide, hafnia, barium oxide, bismuth oxide, tin oxide or mixed oxides.

3. The semiconductor structure according to claim 1, wherein each of the discrete encapsulated semiconductor nanoparticles comprises an additional passivation layer.

4. The semiconductor structure according to claim 1, wherein a concentration of the discrete semiconductor free nanoparticles in the agglomerate is different than or equal to a concentration of the discrete encapsulated semiconductor nanoparticles.

5. The semiconductor structure according to claim 1, wherein the agglomerate comprises a central area and a border area.

6. The semiconductor structure according to claim 5, wherein a concentration of discrete semiconductor free nanoparticles in the border area is equal to or larger than in the central area.

7. The semiconductor structure according to claim 1, wherein the discrete semiconductor free nanoparticles are at least partially located in gaps and/or interstices between the discrete encapsulated semiconductor nanoparticles.

8. A light-emitting device comprising:
an active layer stack configured to emit electromagnetic radiation; and
a conversion element in a radiation beam of the active layer stack comprising a phosphor material and a matrix,
wherein the phosphor material comprises a semiconductor structure comprising an agglomerate of discrete encapsulated semiconductor nanoparticles and discrete semiconductor free nanoparticles,
wherein the discrete encapsulated semiconductor nanoparticles and the discrete semiconductor free nanoparticles have a similar size and a similar shape,
wherein each of the discrete encapsulated semiconductor nanoparticles comprises a quantum dot and an encapsulation comprising an encapsulation material,
wherein the discrete semiconductor free nanoparticles comprise the encapsulation material,
wherein the agglomerate comprises point-to-point connections between the discrete encapsulated semiconductor nanoparticles and the discrete semiconductor free nanoparticles,
wherein the encapsulation material comprises silica, and wherein the point-to-point connections are covalent Si—O bonds.

9. The light-emitting device according to claim 8, wherein the encapsulation material further comprises titanium oxide, zirconium oxide, alumina, magnesium oxide, hafnia, barium oxide, bismuth oxide, tin oxide or mixed oxides.

10. The light-emitting device according to claim 8, wherein the agglomerate comprises a central area and a border area.

11. The light-emitting device according to claim 10, wherein a concentration of discrete semiconductor free nanoparticles in the border area is equal to or larger than in the central area.

12. The light-emitting device according to claim 8, wherein the discrete semiconductor free nanoparticles are at least partially located in gaps and/or interstices between the discrete encapsulated semiconductor nanoparticles.

13. A semiconductor structure comprising:
a plurality of discrete encapsulated semiconductor nanoparticles; and
a plurality of discrete semiconductor free nanoparticles,
wherein the discrete encapsulated semiconductor nanoparticles and the discrete semiconductor free nanoparticles form an agglomerate,
wherein the discrete encapsulated semiconductor nanoparticles and the discrete semiconductor free nanoparticles have essentially the same size and shape,
wherein each of the plurality of discrete encapsulated semiconductor nanoparticles comprises a quantum dot and an encapsulation comprising an encapsulation material,
wherein the discrete semiconductor free nanoparticles comprise the encapsulation material,
wherein the agglomerate comprises point-to-point connections between the discrete encapsulated semiconductor nanoparticles and the discrete semiconductor free nanoparticles,
wherein the encapsulation material comprises silica,
wherein the point-to-point connections are covalent Si—O bonds, and
wherein the discrete encapsulated semiconductor nanoparticles and the semiconductor free nanoparticles are not bonded to each other over a full surface.

* * * * *